United States Patent
Horijon

(10) Patent No.: US 10,517,199 B2
(45) Date of Patent: Dec. 24, 2019

(54) METHODS OF POSITIONING A COMPONENT IN A DESIRED POSITION ON A BOARD, PICK AND PLACE MACHINES, AND SENSORS FOR SUCH PICK AND PLACE MACHINES

(71) Applicant: Assembleon B.V., Eindhoven (NL)

(72) Inventor: Joseph L. Horijon, Eindhoven (NL)

(73) Assignee: Assembléon B.V., Eindhoven (NL)

( * ) Notice: Subject to any disclaimer, the term of this patent is extended or adjusted under 35 U.S.C. 154(b) by 99 days.

(21) Appl. No.: 15/374,501

(22) Filed: Dec. 9, 2016

(65) Prior Publication Data

US 2017/0181340 A1    Jun. 22, 2017

Related U.S. Application Data

(60) Provisional application No. 62/268,578, filed on Dec. 17, 2015.

(51) Int. Cl.
  *G06F 19/00*  (2018.01)
  *H05K 13/04*  (2006.01)
  *H05K 13/08*  (2006.01)

(52) U.S. Cl.
  CPC ..... *H05K 13/0408* (2013.01); *H05K 13/0413* (2013.01); *H05K 13/0813* (2018.08)

(58) Field of Classification Search
  CPC ........... H05K 13/0408; H05K 13/0813; H05K 13/0413; G01B 11/00; B25J 15/065; B25J 9/1633
  See application file for complete search history.

(56) References Cited

U.S. PATENT DOCUMENTS

| | | | |
|---|---|---|---|
| 5,278,634 A | 1/1994 | Skunes et al. | |
| 5,446,323 A * | 8/1995 | Neff | H02K 41/0356 29/834 |
| 5,897,611 A | 4/1999 | Case et al. | |
| 6,195,165 B1 * | 2/2001 | Sayegh | H05K 13/0815 356/613 |
| 6,400,459 B1 | 6/2002 | Haugan et al. | |
| 6,490,048 B1 | 12/2002 | Rudd et al. | |
| 6,583,884 B2 | 6/2003 | Rudd et al. | |
| 6,762,847 B2 | 7/2004 | Duquette et al. | |
| 7,545,514 B2 | 6/2009 | Manickam et al. | |
| 7,746,481 B2 | 6/2010 | Kranz et al. | |

(Continued)

*Primary Examiner* — Michael D Masinick
(74) *Attorney, Agent, or Firm* — Christopher M. Spletzer, Sr.

(57) ABSTRACT

A method of positioning a component in a desired position on a board is provided. The method includes the steps of: (a) picking up the component with a nozzle of a movable placement unit of a pick and place machine; (b) transporting the component towards the board as a function of the desired position; (c) obtaining sensor data about an orientation of the component with respect to the nozzle with a sensor of the placement unit; (d) obtaining in the sensor rotational data about the orientation of the nozzle with respect to the placement unit; (e) combining in the sensor the sensor data and the rotational data into a data set; (f) sending the data set from the sensor to a stationary computer and computing a correction instruction in the stationary computer; and (g) placing the component on the board as a function of the correction instruction from the stationary computer.

5 Claims, 7 Drawing Sheets

(56) References Cited

U.S. PATENT DOCUMENTS

| | | | |
|---|---|---|---|
| 7,941,913 B2 | 5/2011 | Horijon | |
| 8,068,664 B2 | 11/2011 | Rudd et al. | |
| 9,247,685 B2* | 1/2016 | Youngquist | H05K 13/0417 |
| 9,361,682 B2* | 6/2016 | Youngquist | H05K 13/0417 |
| 10,172,270 B2* | 1/2019 | Youngquist | H05K 13/0417 |
| 2010/0295935 A1* | 11/2010 | Case | H05K 13/0812 |
| | | | 348/95 |
| 2012/0197528 A1* | 8/2012 | Le | G01V 11/002 |
| | | | 702/7 |
| 2014/0263578 A1* | 9/2014 | Youngquist | H05K 13/0417 |
| | | | 228/103 |
| 2014/0267682 A1* | 9/2014 | Youngquist | H05K 13/0417 |
| | | | 348/87 |
| 2014/0270473 A1* | 9/2014 | Youngquist | H05K 13/0417 |
| | | | 382/147 |
| 2014/0271082 A1* | 9/2014 | Youngquist | H05K 13/0417 |
| | | | 414/749.1 |
| 2017/0171319 A1* | 6/2017 | Hall | H04L 67/141 |

* cited by examiner

METHODS OF POSITIONING A COMPONENT IN A DESIRED POSITION ON A BOARD, PICK AND PLACE MACHINES, AND SENSORS FOR SUCH PICK AND PLACE MACHINES

CROSS-REFERENCE TO RELATED APPLICATION

This application claims the benefit of U.S. Provisional Application No. 62/268,578, filed Dec. 17, 2015, the contents of which are incorporated herein by reference.

FIELD

The invention relates to methods of positioning components in desired positions on a board, whereby a component is picked up with a nozzle of a movable placement unit of a pick and place machine. The invention also relates to pick and place machines, and sensors for such pick and place machines.

BACKGROUND

Using a pick and place machine, a component is rotatable with a nozzle (about a rotation axis of the nozzle) in and opposite to a φ-direction, and movable with the nozzle in (i) an XY-plane extending perpendicular to the rotation axis, and (ii) in a Z-direction extending parallel to the rotation axis.

Several methods are known to determine the orientation of a component with respect to a nozzle and/or the pick and place machine. The word "orientation", used with respect to the component, will be used throughout this document to comprise both the angular position of the component with respect to a nominal φ reference as well as the (x, y) position of the component with respect to a nominal (x, y) reference. Such nominal φ reference may be the reference of rotation axis of the nozzle (e.g., an index position), whilst the nominal (x, y) reference may be the Y-plane extending perpendicular to the rotation axis, centered to the rotation point of the rotational axis. However, other references in the pick and place machine may be used as well.

By a prior art method, sensor data of a sensor is sent to a stationary alignment processing unit. From an actuator for rotating the nozzle, encoder data is also sent to the stationary alignment processing unit. In the alignment processing unit the sensor data and the encoder data are real time combined and are used to compute a correction instruction. The correction instruction from the alignment processing unit is being used to instruct a motion control unit of the actuator. The alignment processing unit and the motion control unit can be located in the same housing or in different housings.

The sensor, the actuator, and the nozzle are typically located in a placement unit, which is movable with respect to the board on which the component is to be placed. The alignment processing unit is located stationary in, or outside, the pick and place machine.

One disadvantage of such a prior art method is that the data from the sensor and the actuator need to be transferred over a relatively large distance to the stationary alignment processing unit, before the sensor data and encoder data are combined. Another disadvantage of such a prior art method is that typically, the sensor read out timing is not synchronised with the rotational speed of the nozzle and one has to operate with constant velocities to minimize jitter between encoder data and sensor data.

To keep data latencies in both communication paths small, including the data transfer in the processing unit, a real time processing environment is desirable.

U.S. Pat. No. 6,195,165 discloses a method whereby the angular position of a component with respect to a nozzle is being sensed and a correction instruction is being computed. The sensing and computing are both carried out in a sensor. The correction instruction is communicated to the pick and place machine and the component is placed on the board as a function of the correction instruction.

By this method, information about the angular position of the nozzle from the actuator, and information from the sensor, are real time combined in the sensor and are used to compute the correction instruction. The computing is being done in a computing part of the sensor.

Such an approach has the advantage in that the distance between the actuator, a sensing part of the sensor and the computing part of the sensor are relatively short. However, typically, the housing of the sensor is small and directly mounted in the placement unit, which also carries the nozzle. Local heat production is to be kept low to prevent heating up of the placement unit. Heat would lead to thermal expansion having a negative effect on placement accuracy. Therefore, power of the processing electronics in the sensor has to be limited. This puts restrictions on the complexity and the speed of calculations to be performed in the sensor. In practice, the rotational speed is typically kept substantially constant, to enable fixed frequency sensor read out and to be able to apply simpler processing routines. Storing of information about the angular position of the nozzle from the actuator and information from the sensor for later analysis is not practical since the memory in the sensor is limited.

Thus, it would be desirable to provide improved pick and place machines, improved sensors for pick and place machines, and improved methods of positioning a component on a board.

SUMMARY

According to an exemplary embodiment of the invention, a method of positioning a component in a desired position on a board is provided. The method includes the steps of: (a) picking up the component with a nozzle of a movable placement unit of a pick and place machine; (b) transporting the component towards the board as a function of the desired position; (c) obtaining sensor data about an orientation of the component with respect to the nozzle with a sensor of the placement unit; (d) obtaining in the sensor rotational data about the orientation of the nozzle with respect to the placement unit; (e) combining in the sensor the sensor data and the rotational data into a data set; (f) sending the data set from the sensor to a stationary computer and computing a correction instruction in the stationary computer; and (g) placing the component on the board as a function of the correction instruction from the stationary computer.

According to another exemplary embodiment of the invention, a pick and place machine is provided. The pick and place machine includes: a component conveyor system; a board conveyor system; a stationary computer; and at least one movable placement unit including a nozzle and a sensor. The placement unit is configured to move relative to the component conveyor system and the board conveyor system. The sensor includes: a receive circuit in the sensor (e.g., within a housing of the sensor) configured to receive rotational data about a rotational position of the nozzle; optics and detection electronics in the sensor (e.g., within a housing of the sensor) configured to obtain sensor data about the orientation of a component removably attached to the nozzle; and a signal processing circuit in the sensor (e.g., within a housing of the sensor) configured to combine the rotational data and the sensor data into a data set and to send the data set to the stationary computer. The stationary computer includes: a receive circuit to receive the data set from the sensor; and a signal processing circuit to compute a correction instruction from the data set and to output the correction instruction as a correction signal to the at least one movable placement unit.

According to yet another exemplary embodiment of the invention, a sensor for a pick and place machine is provided. The pick and place machine includes at least one nozzle and a stationary computer. The sensor includes: (a) a receive circuit in the sensor (e.g., within a housing of the sensor) configured to receive rotational data about a rotational position of the nozzle; (b) optics and detection electronics in the sensor (e.g., within a housing of the sensor) configured to obtain sensor data about the orientation of a component removably attached to the nozzle; and (c) a signal processing circuit in the sensor (e.g., within a housing of the sensor) configured to combine the rotational data and the sensor data into a data set and to send the data set to the stationary computer.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

Like elements/parts may be labelled with the same numerals in the various drawings, regardless of whether the an element/part of a conventional structure or an inventive structure.

DETAILED DESCRIPTION

Figure 1:
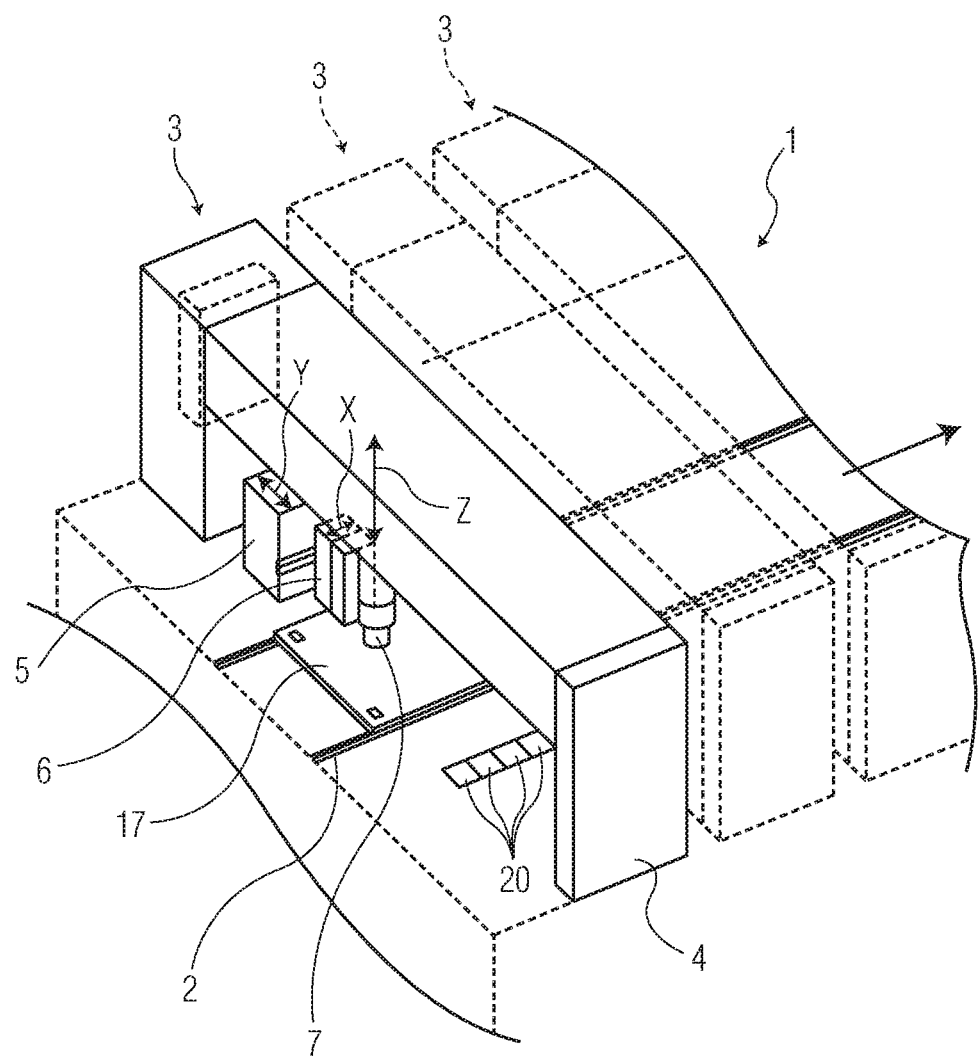
FIG. 1 is a perspective view of a part of a conventional pick and place machine.

As used herein, the term "component" refers to the broad class of components that may be "picked" and "placed" using a pick and place machine. Exemplary components include semiconductor die, capacitors, resistors, integrated circuits, packaged devices, amongst many others.

As used herein, the term "board" refers to the broad class substrates to which a component may be placed using a pick and place machine. Exemplary boards (also referred to as substrates) include printed circuit boards, leadframes, wafers, glass substrates, metal plates, among many others.

The invention relates to methods of positioning components in desired positions on a board, whereby a component is picked up with a nozzle of a movable placement unit of a pick and place machine. The placement unit includes a sensor. After determining the orientation of the component with respect to the nozzle, the component is placed with a correct orientation in the desired position on the board. The invention also relates to pick and place machines for performing such methods, and sensors for such pick and place machines.

It is an object of the invention to provide a method of positioning a component in a desired position on a board, whereby the orientation of the component can easily and reliably be determined before placement on the board.

It is another object of the invention to provide a method of positioning a component in a desired position on a board, whereby it is possible to maintain the obtained data for determining the orientation of the component for later analysis.

According to aspects of the invention, combining sensor data and corresponding rotational data into a data set in the sensor (e.g., within a housing of the sensor) has the advantage that a relatively small signal processing circuit may be used. Such a signal processing circuit may utilize a small amount of power so that the risk of local heat production is significantly reduced. Further, the lower demands of the signal processing electronics provides an opportunity for the sensor to have a lower cost. Further still, since the combining of the data into the data set takes place in the sensor, the distance between the location where the sensor data is obtained and the signal processing circuit, as well as the distance between the location where the sensor rotational data is obtained and the signal processing circuit, are relatively small. Thus, the data set may be generated in a reliable manner. The data set may be transferred real time or non-real time to the stationary computer, in which the data set may be processed at any desired moment. Further, the sensor data may easily be synchronised with the rotational speed of the nozzle and the sensor rotational data so that the nozzle can also be rotated at varying velocities.

The combined data set is sent to a stationary computer where the more complex and flexible processing can be performed in a non real-time environment. The stationary computer can be provided with as many CPUs (and as much RAM) as desired, since there is no risk that the amount of power needed to run the computer will cause local heat production in the placement unit.

According to certain exemplary embodiments of the invention, the steps of (i) obtaining in the sensor rotational data about the orientation of the nozzle with respect to the placement unit, and (ii) of combining in the sensor the sensor data and the rotational data into a data set, may be performed at a number of different rotational positions of the nozzle with respect to the pick and place machine—where a number of the data sets of sensor data and corresponding rotational data are sent to the stationary computer and the correction instruction is computed in the stationary computer based on the number of data sets. By obtaining a number of data sets the accuracy whereby the orientation of the component can be determined is further improved.

According to certain exemplary embodiments of the invention, sensor data is obtained at equidistant rotational positions. As the rotational data is already available in the sensor, the sensor data and rotational data can easily be synchronised, even with large variations in rotational speed.

According to certain exemplary embodiments of the invention, the inventive methods of positioning components in desired positions on a board includes steps of storing the data sets in the stationary computer, and computing the correction instruction after at least a number (e.g., a predetermined number) of data sets have been received in the stationary computer.

The data sets may temporally be stored—as measurement time in the sensor takes typically longer than the high speed processing power in a stationary computer. In such cases, extensive processing power may not be needed in the sensor. The processing power in the sensor can be implemented, for example, in a FPGA having a small footprint and low power requirements. It is also possible to store the data sets for future analyses.

According to certain exemplary embodiments of the invention, a step of pre-processing the sensor data in the sensor (to compress the sensor data into compressed sensor data) is performed, and then the compressed sensor data and the rotational data are combined into the data set. By compressing the sensor data, a compressed data set is obtained, which may reduce data traffic and the need for high speed communication means from the sensor to the stationary computer. The compressed sensor data may include, for example, only information about the locations of the edges of the contour of the component in the image. Other image compression techniques, such as JPEG compression, may be applied. Further, other data reduction techniques may be used such as, for example, region-of-interest selection, where only image data near the contour edges are transferred.

In accordance with various aspects of the invention, since the signal processing circuit in the sensor will mainly be used to combine the sensor data and the rotational data into a data set, while the signal processing circuit in the stationary computer is used for processing the data set, the signal processing circuit in the sensor can be relatively simple compared to the stationary computer.

In embodiments of the invention where a pick and place machine includes a plurality of movable placement units (where each placement unit is provided with a sensor according to the invention), the stationary computer can be used by a number (perhaps all) of the placement units. The costs for the relatively simple signal processing circuit in the sensors of the placement units will be relatively low, while only one expensive stationary computer may be utilized.

In certain embodiments of the invention, the sensor includes a light source to obtain a desired illumination of the component to be able to take an image of the component by the detection electronics, or to cast a shadow of the component on the detection electronics.

According to certain embodiments of the invention, the sensor data is representative of a side image of the component, wherein the signal processing circuit in the stationary computer is adapted to compute the shape of the visual hull of the component at a plurality of rotational positions. In side images of the component, the location of edges of a contour of the component will be clearly visible. The location of the edges of the contour varies during rotation of the component. Based on the displacement of the location of the edges, the location of the corners of the component may be determined.

As described above (e.g., in the SUMMARY section of the application), inventive sensors for pick and place machines are provided. Using such inventive sensors, the orientation of components may be determined with improved performance in terms of time, reliability and/or accuracy. Since the signal processing circuit in such sensors is primarily used to combine the sensor data and the rotational data into a data set, while processing the data set will be done in the stationary computer, the signal processing circuit in the sensor can be relatively simple. However, since the signal processing circuit is relatively close to the receive circuit and the detection electronics in the sensor, real time formation of data sets may easily and reliably be completed.

Figure 2:
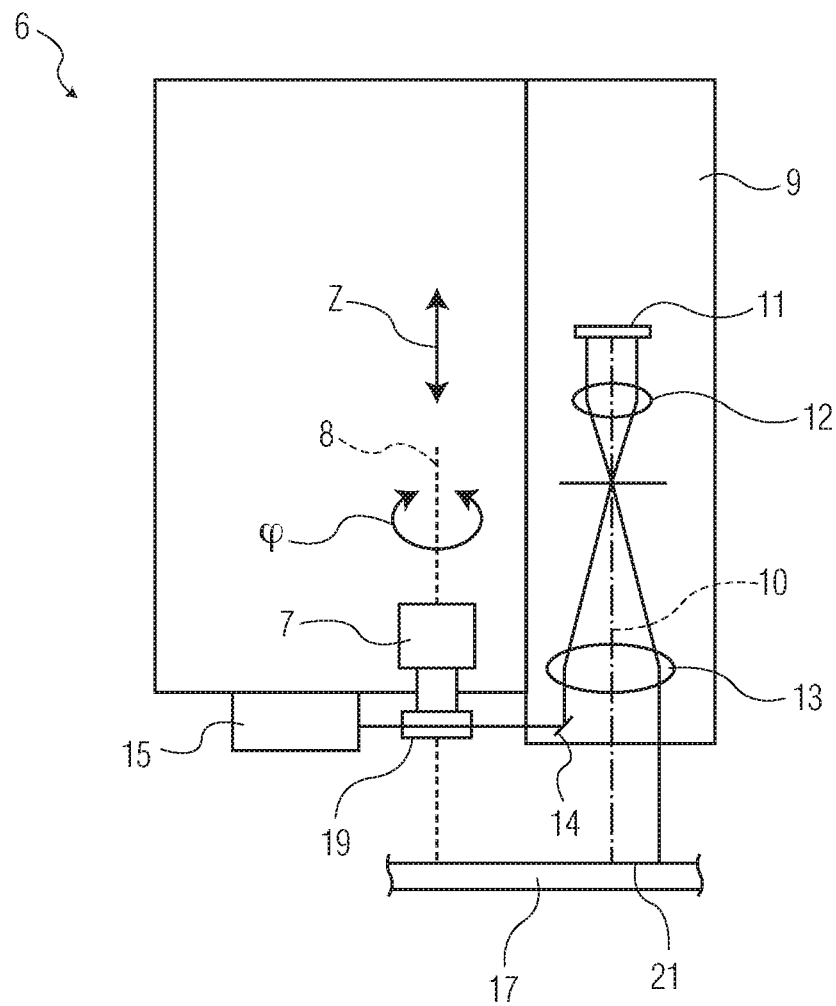
FIG. 2 is a side view of a component placement unit of the conventional pick and place machine of FIG. 1.

FIG. 1 shows a perspective view of a part of a pick and place machine 1 as described in U.S. Pat. No. 7,941,913. The pick and place machine 1 includes a substrate feed-in/feed-out device 2 and three component placement units 3. The substrate feed-in/feed-out device 2 forms a board conveyor system. Each component placement unit 3 includes an elongated U-shaped frame 4, a first slide 5, which is movable in the direction indicated by the double arrow Y with respect to the frame 4, and a second slide 6, which is movable in the direction indicated by the double arrow X with respect to the first slide 5. The second slide 6 is provided with a nozzle 7, which is movable in the direction indicated by the double arrow Z with respect to the second slide 6. As FIG. 2 clearly shows, the nozzle 7 is rotatable in the directions indicated by the double arrow $\varphi$ about the central axis 8, which extends parallel to the Z-direction. The second slide 6 is furthermore provided with a device 9, an optical axis 10 of which extends parallel to the central axis 8. The device 9 includes an imaging device 11, lenses 12, 13 disposed in front thereof, a deflection mirror 14 disposed partially in front of the lens 13, and a light source 15. The deflection mirror 14 includes an angle of 45° with the optical axis 10. The lenses 12, 13 form a telecentric optical element, a first focus plane 16 of which coincides with the central axis 8 of the nozzle 7. The first focus plane 16 furthermore coincides with a substrate 17 supported by the substrate feed-in/feed-out device 2. A second focus plane 18 of the optical element formed by the lenses 12, 13 coincides with the imaging device 11.

The light source 15 is located on a side of the optical element 12, 13 remote from the focus plane 16 and provides a diffuse illumination, for example, of a component 19 that has been picked up by the nozzle 7 (e.g., through the application of a vacuum). The component 19 has been picked up by the nozzle 7 from a component supply position 20 of a component conveyor system. The nozzle 7 has been moved in directions indicated by the arrows X and Y in a manner which is known in the art.

While the component 19 is being moved from the component supply position 20 to a desired position 21 on the substrate 17, the nozzle 7 with the component 19 adhering thereto is rotated in the directions indicated by the double arrow $\varphi$ about the central axis 8. During the rotation, images of the contours of the component 19 present in the focus plane 16 are produced by means of the imaging device 11 at a number of rotational positions that are known in advance. From the images of the contours the position and orientation of the component 19 with respect to the nozzle 7 can be determined by means of an arithmetic unit. Further, one or more images of the position 21 on the substrate 17 are produced by means of the imaging device 11. From the images, which have been produced at a position of the slide 6 with respect to the frame 4 that is stored in an arithmetic unit, the location of the position 21 with respect to the nozzle 7 (and thus of the component 19) with respect to the position 21 can be determined. Subsequently, the component 19 can be placed precisely at the desired location 21.

Since the lenses 12, 13 are located beside the central axis 8, the component 19 can be placed on the substrate 17 without a need to move parts of the imaging device 11. In this way it is ensured that the various elements of the component placement unit will remain correctly positioned relative to each other.

Since the contours of the component 19 are sensed by means of the imaging device 11, the position and orientation of the component 19 with respect to the nozzle 7 can be determined in a relatively simple manner. Since the optical element is telecentric, a clear image of the component 19 is obtained and the location of the edge of the component on the imaging device 11 does not change when the contour point of component is not in focus.

Figure 3:
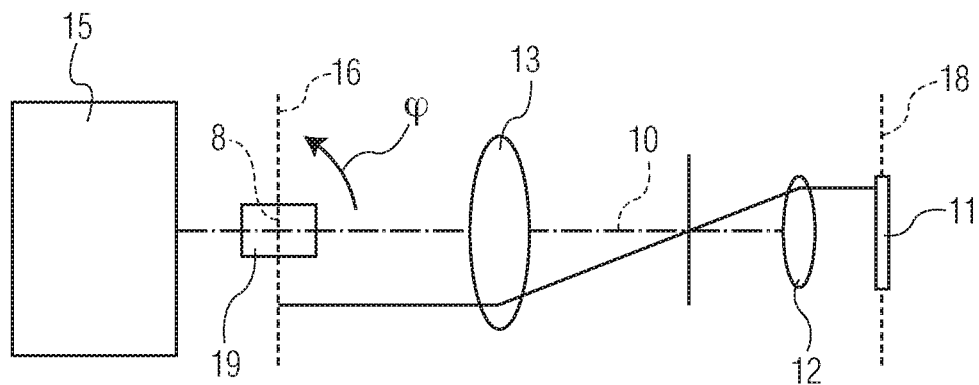
FIG. 3 is a developed plan view of the optical light path of the conventional component placement unit of FIG. 2.

In the situation that is shown in FIG. 3, the central axis 8 intersects the optical axis 10. Such a position of the central axis 8 is in particular suitable for the comparatively small components 19, whose entire contour can be imaged on the imaging device 11. In the case of a larger component 19, it is advisable to position the central axis 8 some distance away from the optical axis 10, with the central axis 8 still lying in the focus plane 16. In such a position, only a side of the component 19 located near the optical axis 10 will be imaged on the imaging device 11. By causing the component 19 to rotate about the central axis 8, however, the position of the component 19 with respect to the central axis 8 can nevertheless be determined after a full rotation of the component and after a number of images of the contours of the component 19 have been produced.

The light source 15 may be, for example, a non-coherent light source, to eliminate diffraction effects. Collimated illumination using relatively small single LED light sources and telecentric imaging can be combined as well.

Using imaging optics provides a higher optical resolution in the focal plane of the imaging optics, which enables smaller and thinner components to be aligned. When components 19 become very thin (e.g. on the order of 10 μm thick), due to mechanical tolerances in the placement set up, especially the tilt of the component with respect to the nozzle, it will be difficult to determine the correct edges of the component. By using a 2D photodiode array detector, multiple lines can be acquired instead of only one single line at each acquisition orientation. By combining the information in those lines, the actual correct edge position can be found.

Another advantage of using imaging optics is less sensitivity to obstruction by dust particles on the optical elements as the imaging light is out of focus at the lens and illumination elements. In such telecentric imaging set up, also the edge positions in the silhouette images have to be processed into the component dimensional data.

Figure 4:
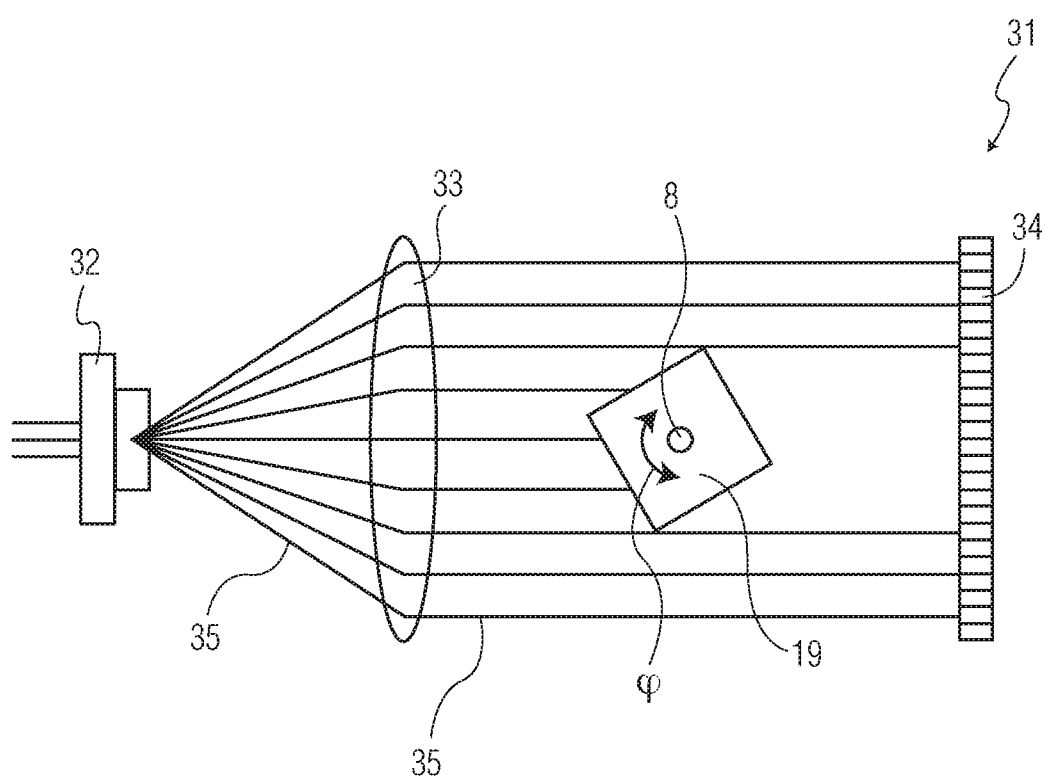
FIG. 4 is a top view of another embodiment of a conventional sensor.

FIG. 4 is a top view of another embodiment of a prior art sensor 31 comprising a laser diode 32, a collimating lens 33 and a photodiode array 34. A component 19 is rotatable in the directions indicated by the double arrow φ about the central axis 8 between the collimating lens 33 and the photodiode array 34.

A collimated laser beam 35 illuminates the component 19 perpendicular to the rotating axis 8. The component 19 in the collimated laser beam 35 casts a shadow onto the photodiode array 34, such that the position and size of the silhouette of the component 19 on the photodiode array 34 can be determined from the edge positions of the shadow. While the component 19 rotates, shadow images are acquired at multiple orientations of the component 19. By combining the edge positions in the shadow images the offset in x, y and φ of the component 19 with respect to the rotation axis 8 may be determined. Using coherent laser beams offers the advantage of well-defined directionality of the light.

Figure 5A:
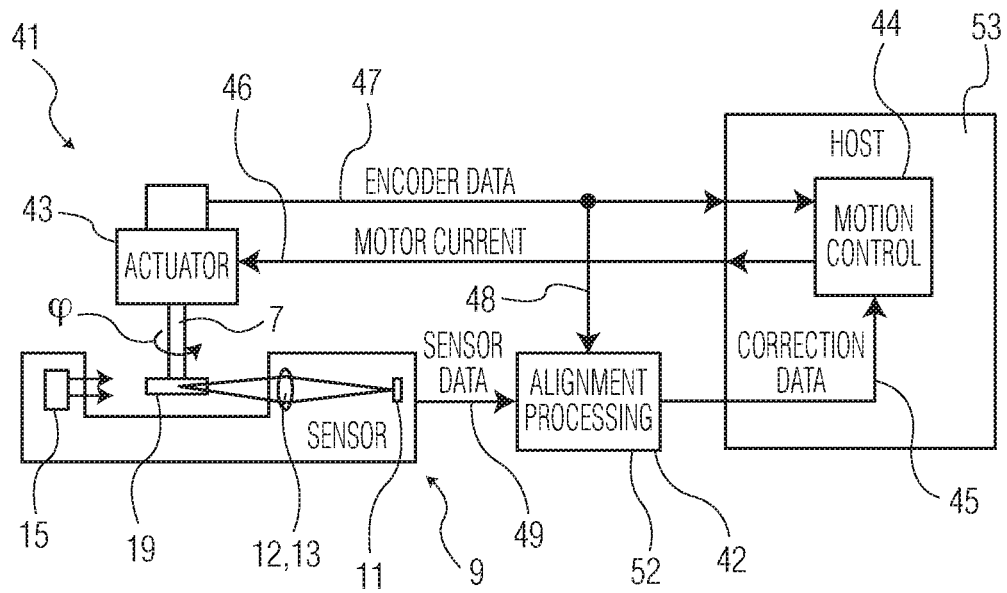
FIGS. 5A-5C are schematic views of three different conventional pick and place machines.
Figure 5B:
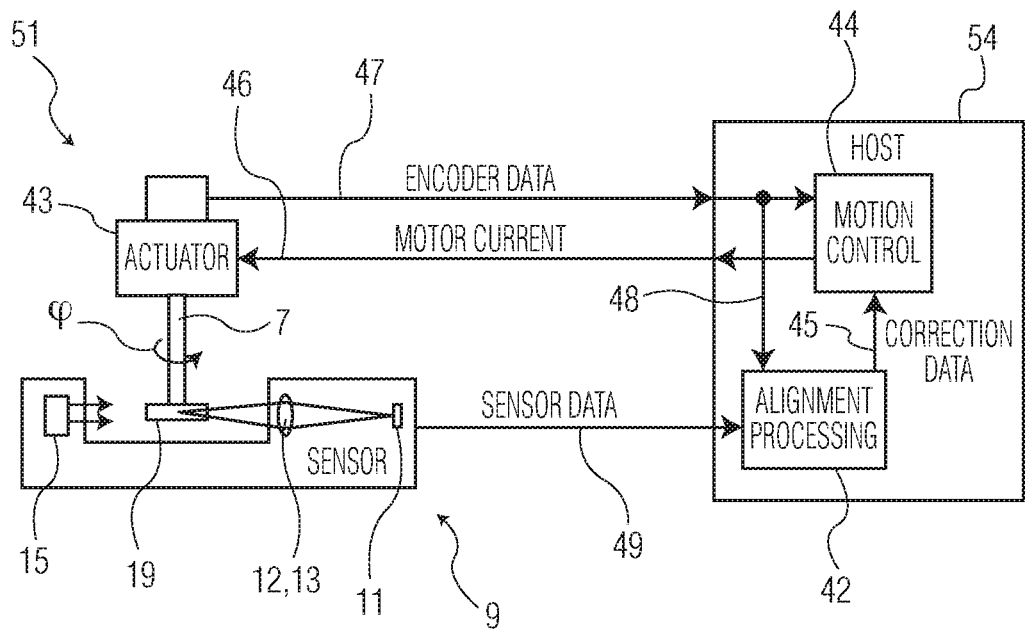
Figure 5C:
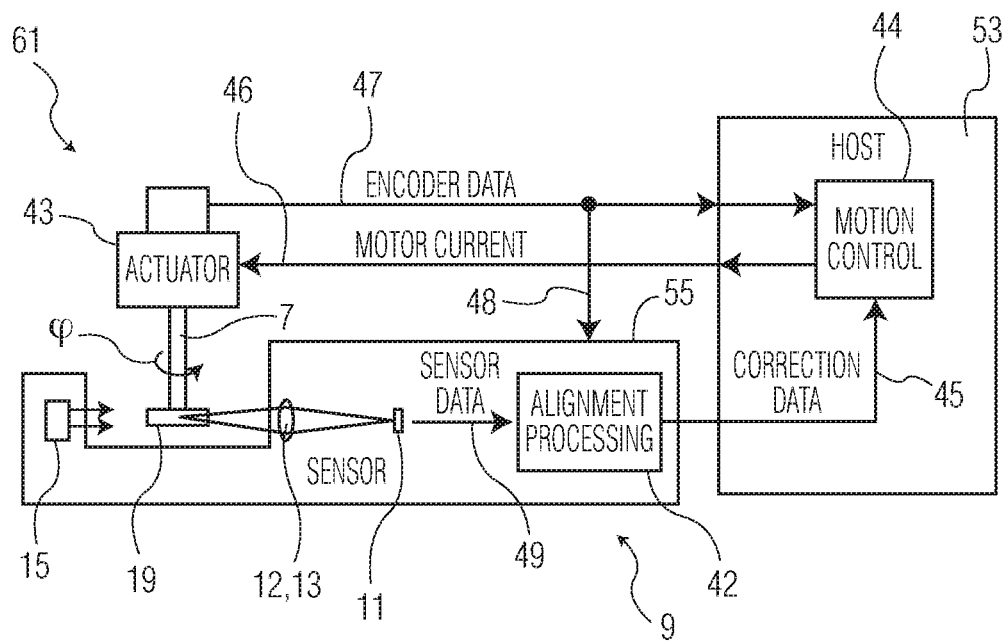

FIGS. 5A-5C are schematic views of three different prior art pick and place machines 41, 51, 61. Each pick and place machine 41, 51, 61 includes a sensor 9, an alignment processing unit 42, an actuator 43 to rotate the nozzle 7 and the component 19 attached thereto, and a motion control unit 44 to activate the actuator 43. Correction data is sent from the alignment processing unit 42 to the motion control unit 44 over line 45. A motor current is sent from the motion control unit 44 to the actuator 43 over line 46. Encoder data is sent from the actuator 43 to the motion control unit 44 over line 47. The encoder data is also sent from the actuator 43 to the alignment processing unit 42 over line 48. Sensor data is sent from the sensor 9 to the alignment processing unit 42 over line 49.

Encoder data and sensor data are inserted into the alignment processing unit 42 along two different lines 48, 49. In the alignment processing unit 42 the encoder data and corresponding sensor data are synchronised and correction data is computed based on the encoder data and corresponding sensor data. The correction data is used to correct the motion control unit 44 so that the component 19 will be placed with the correct orientation on the board.

The pick and place machines 41, 51, 61 differ from each other in the location of the alignment processing unit 42.

By the pick and place machine 41, the alignment processing unit 42 is located in a first stationary computer 52, while the motion control unit 45 is located in a second stationary computer 53. The word "stationary" means that the computer does not move with the nozzle 7 and the sensor 9 over the board.

By the pick and place machine 51, the alignment processing unit 42 and the motion control unit 45 are located in the same stationary computer 54. By having the alignment processing unit 42 located stationary at a distance from the movable nozzle 7 and movable sensor 9, the sensor data and encoder data is transferred over a relatively large distance to the stationary alignment processing unit, before the sensor data and encoder data are combined.

By the pick and place machine 61, the alignment processing unit 42 is located in the same housing 55 as the sensor 9 and moves simultaneously with the sensor 9. The motion control unit 45 is located in the stationary computer 53. By having the alignment processing unit integrated in the same housing as the sensor 9, there is a risk of local heat production and thermal expansions, which have a negative effect on the placement accuracy. Therefore, power of the processing electronics in the alignment processing unit has to be limited. This puts restrictions on the complexity and the speed of calculations to be performed in the housing 55.

By each of the prior art pick and place machines 41, 51, 61, the encoder data and sensor data are inserted into the alignment processing unit 42 along two different lines 48, 49, whereby the encoder data and sensor data are synchronized in the alignment processing unit 42, where after the correction data is computed based on the encoder data and corresponding sensor data.

Figure 6:
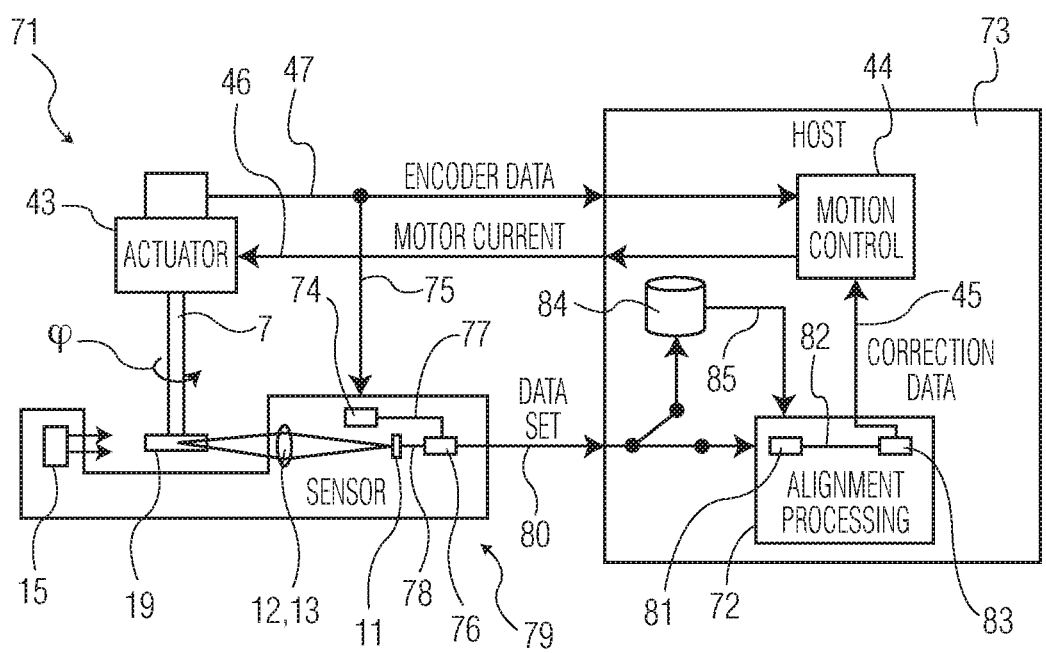
FIG. 6 is a schematic view of a pick and place machine according to an exemplary embodiment of the invention.

FIG. 6 is a schematic view of a system of a pick and place machine 71 according to an exemplary embodiment of the invention. The pick and place machine 71 comprises a sensor 79, an alignment processing unit 72, an actuator 43 to rotate the nozzle 7 and the component 19 attached thereto, and a motion control unit 44 to activate the actuator 43. Correction data is sent from the alignment processing unit 72 to the motion control unit 44 over line 45. A motor current is sent from the motion control unit 44 to the actuator 43 over line 46. Encoder data is sent from the actuator 43 to the motion control unit 44 over line 47.

The alignment processing unit 72 and the motion control unit 44 are located in a stationary computer 73. If desired, the motion control unit 44 can be located outside the stationary computer 73.

The lenses 12, 13 form optics of the sensor 79, while light source 15 and the imaging device 11 are part of detection electronics in the sensor 79. The optics and detection electronics are configured to obtain sensor data about the position of a component 19 removably attached to the nozzle 7.

The sensor 79 includes a receive circuit 74 configured to receive rotational data, for example, encoder data, from the actuator 43 about a rotational position of the nozzle 7 over line 75. The rotation data is sent from the receive circuit 74 to a signal processing circuit 76 over line 77. The sensor data is sent from the imaging device 11 to the signal processing circuit 76 over line 78.

In the signal processing circuit 76 the rotational data and the sensor data are combined into a data set. The data set is sent from the signal processing circuit 76 to the alignment processing unit 72 in the stationary computer 73 over line 80.

The alignment processing unit 72 in the stationary computer 73 includes a receive circuit 81 to receive the data set over line 80 from the signal processing circuit 76 in the sensor 79. From the receive circuit 81 the data set is sent over line 82 to a signal processing circuit 83 in the alignment processing unit 72 of the stationary computer 73. In the signal processing circuit 83 a correction instruction is computed from the data set. The correction instruction is sent as a correction data from the signal processing circuit 83 via the motion control unit 44 to the actuator 43 of the nozzle 7 to bring the component 19 in the correct angular position before mounting the component 19 on the board. Furthermore, the correction data is also sent to actuators of the first and second slides 5, 6 to position the component 19 above the desired position on the board. At the desired position the nozzle 7 is being moved in z-direction to position the component on the board.

Instead of transferring signals over lines (wires or other connections) it is, of course, also possible to send at least some of the signals via wireless transmission.

The stationary computer 73 can also be provided with a data storage 84 into which the data set can be entered via line 80 and stored. From the data storage 84 the data set is entered into the alignment processing unit 72 via line 85, whereby the correction instruction is computed after at least a number of data sets have been received. The data sets in the data storage 84 may be deleted after the correction data has been computed, or may be maintained for later evaluation.

Figure 7A:
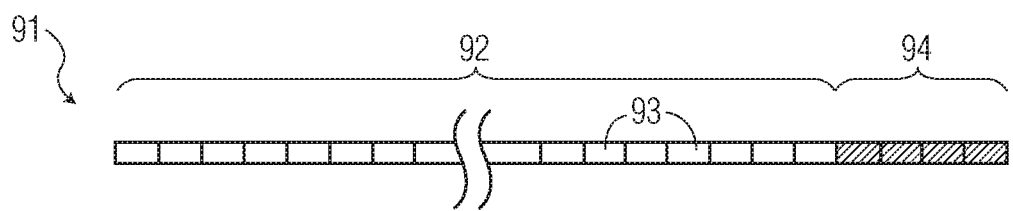
FIGS. 7A-7E are five different data sets of the pick and place machine of FIG. 6.
Figure 7B:
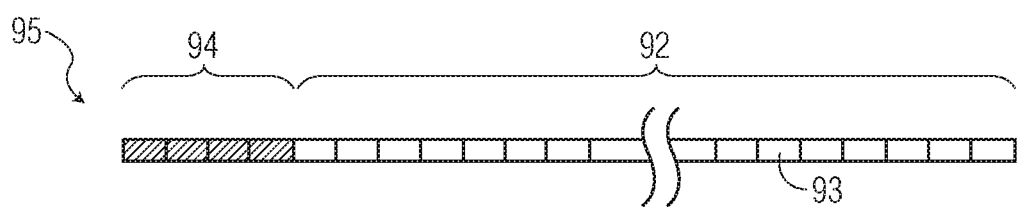
Figure 7C:
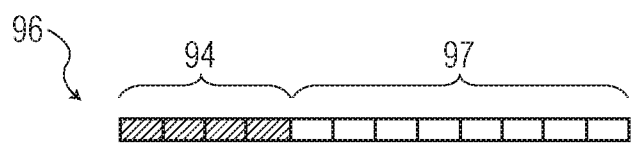
Figure 7D:
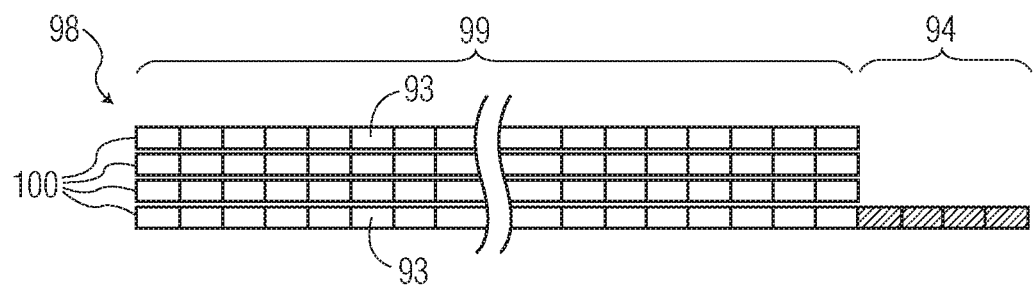
Figure 7E:
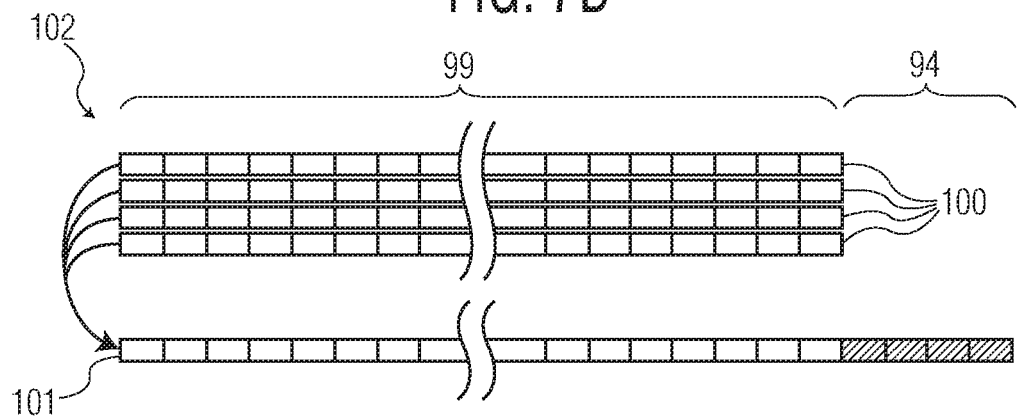

FIGS. 7A-7E show five different data sets of the pick and place machine shown in FIG. 6. FIG. 7A shows a data set 91 including an array of sensor data 92 (e.g., pixel values 93), which is extended with the rotational data 94 (e.g., encoder data) by appending the rotational data 94 to the array of sensor data 92. FIG. 7B shows a data set 95 which differs from the data set 91 in that the order of appending is reversed, first rotational data 94 and then sensor data 92. FIG. 7C shows a data set 96, whereby the sensor data is being pre-processed to include only essential pixel position data and by that compressing the amount of sensor data to be sent. The compressed sensor data 97 is combined with the rotational data 94. FIG. 7D shows a data set 98, wherein the sensor data 99 includes multiple sensor data lines 100, captured at the same encoder position. FIG. 7E shows a data set 102, data of multiple lines 100 can be combined into one single line 101 by applying simple arithmetic operations, like summing, averaging or sensing minimum or maximum values of corresponding positions. In case of multiple lines 100, the data can even be compressed further into the essential pixel position data. The combining of multiple lines as well as the compression of the sensor data utilizes little data processing, and can easily be done in the relatively simple signal processing circuit 76 of the sensor 79.

Figure 8:
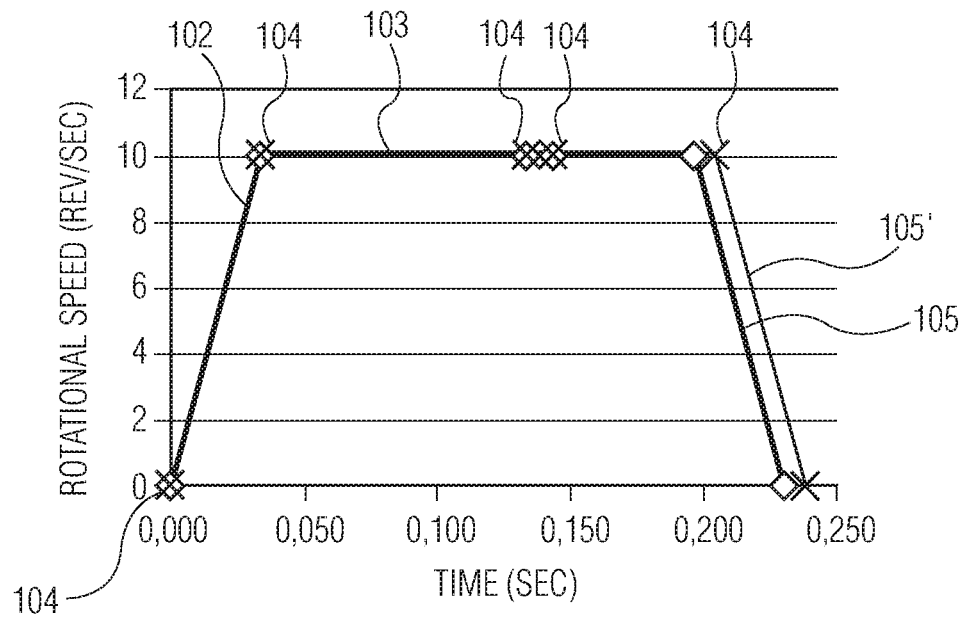
FIG. 8 is a speed-time diagram of a nozzle rotating at a constant rotational speed when obtaining sensor data according to an exemplary embodiment of the invention.

FIG. 8 is a speed-time diagram of a nozzle 7 rotating at a constant rotational speed when obtaining sensor data. As can be seen in the diagram the constant rotational speed may be, for example, 10 revolutions/second, whereby the acceleration and the time needed to obtain the sensor data are limited.

In the first part 102 during about 0.04 seconds the nozzle 7 starts rotating and is accelerated. Further, the nozzle 7 is moved upwardly in the z-direction to position the component 19 in the sensor 79. During the second part 103 the nozzle 7 rotates at a constant rotational speed of 10 revolutions/second. During this second part 103 images are taken by the sensor 79 at different points of time 104. In the third part 105, 105' the nozzle 7 is slowed down and based on the calculated correction data rotated to the desired angular position. Further, the nozzle 7 is moved downwardly in z-direction out of the sensor 79. Depending on the desired correction, the nozzle 7 will follow part 105 or 105'. The total time is approximately 0.25 seconds.

Figure 9:
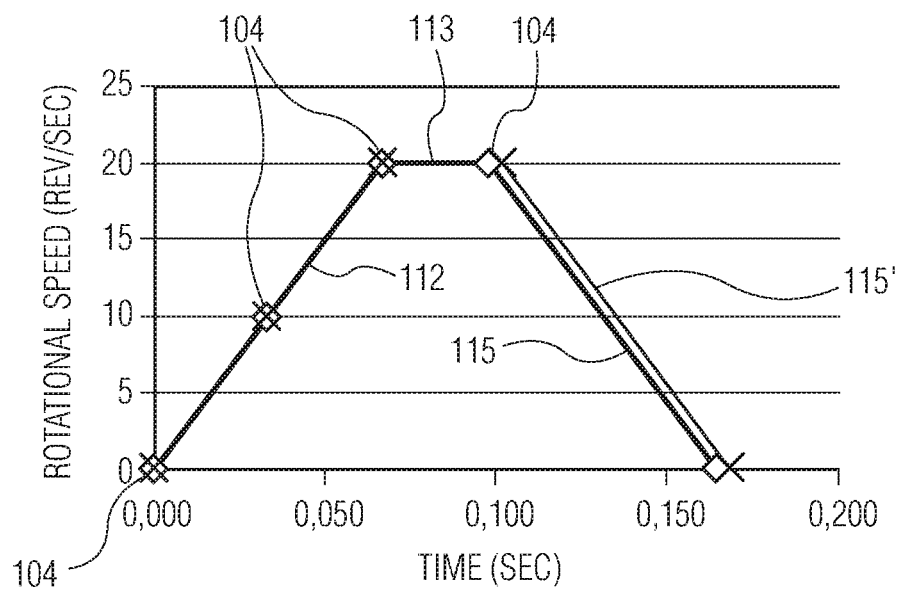
FIG. 9 is a speed-time diagram of a nozzle rotating at a varying rotational speed when obtaining sensor data according to an exemplary embodiment of the invention.

FIG. 9 is a speed-time diagram of a nozzle 7 rotating at a varying rotational speed when obtaining sensor data. In the first part 112 the nozzle 7 starts rotating and is accelerated with the same acceleration as in FIG. 8. Further, the nozzle 7 is moved upwardly in z-direction to position the component 19 in the sensor 79. During the second part 113 the nozzle 7 rotates at a constant rotational speed of 20 revolutions/second. During the first part 112, as well as during the second part 113, images are taken by the sensor 79 at different points in time 104. In the third part 115, 115' the nozzle 7 is slowed down and based on the calculated correction data rotated to the desired angular position. Further, the nozzle 7 is moved downwardly in z-direction out of the sensor 79. Depending on the desired correction, the nozzle 7 will follow part 115 or 115'. The total time is about 0.17 seconds.

With the pick and place machine 71 of the invention it is possible to use both speed-time diagrams as shown in FIGS. 8 and 9. For example, the speed-time diagram shown in FIG. 9 may desirably be used, because of the shorter total time. This shorter time is possible since also during the acceleration part images can be taken, as the rotational data is directly available in the sensor 79 and can be immediately be combined with the corresponding sensor data in the sensor 79 into a data set.

By the pick and place machine 71 the sensor 79 is only used for determining the orientation of the component 19 on the nozzle 7. It is also possible to use the sensor 79 for determining the desired position on the board as by the pick and place machine 1.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of positioning a component in a desired orientation and position on a board, the method comprising the steps of:
   (a) picking up the component with a nozzle of a movable placement unit of a pick and place machine, the moveable placement unit including (i) a sensor for use in providinf a correction instruction for alignment of the component with respect to the board, (ii) an actuator for rotating the nozzle and the component attached thereto, the actuator including a rotational encoder;
   (b) transporting the component towards the board as a function of the desired position;
   (c) obtaining image sensor data about an orientation of the component with respect to the nozzle with an imaging device of the sensor;
   (d) obtaining rotational encoder data about the orientation of the nozzle with respect to the placement unit from the encoder;
   (e) combining in the sensor (i) the image sensor data from the imaging device, and (ii) the rotational encoder data from the encoder, into a data set;
   (f) sending the data set from the sensor to a stationary computer and computing the correction instruction in the stationary computer; and
   (g) placing the component on the board as a function of the correction instruction from the stationary computer.

2. The method of claim 1, wherein the steps (d) and (e) are performed at a number of different rotational positions of the nozzle with respect to the pick and place machine, wherein a number of the data sets of image sensor data and corresponding rotational encoder data are sent to the stationary computer and the correction instruction is computed in the stationary computer based on the number of data sets.

3. The method of claim 2, wherein the image sensor data is obtained at equidistant rotational positions.

4. The method of claim 2, wherein the method further comprises the step of storing the data sets in the stationary computer, and computing the correction instruction after at least a number of data sets have been received in the stationary computer.

5. A method of claim 1, wherein the method comprises the step of pre-processing the image sensor data in the sensor to compress the image sensor data into compressed image sensor data, and combining the compressed image sensor data and the rotational encoder data into the data set.

* * * * *